(12) United States Patent
Didion et al.

(10) Patent No.: US 11,653,441 B2
(45) Date of Patent: May 16, 2023

(54) PRINTED CIRCUIT BOARD

(71) Applicants: STMicroelectronics (Alps) SAS, Grenoble (FR); STMicroelectronics (Grenoble 2) SAS, Grenoble (FR)

(72) Inventors: Julien Didion, Grenoble (FR); Thierry Lapergue, Fontaine (FR)

(73) Assignees: STMicroelectronics (Alps) SAS, Grenoble (FR); STMicroelectronics (Grenoble 2) SAS, Grenoble (FR)

(*) Notice: Subject to any disclaimer, the term of this patent is extended or adjusted under 35 U.S.C. 154(b) by 415 days.

(21) Appl. No.: 16/951,695

(22) Filed: Nov. 18, 2020

(65) Prior Publication Data

US 2022/0151056 A1  May 12, 2022

(30) Foreign Application Priority Data

Nov. 12, 2020 (FR) ...................... 2011603

(51) Int. Cl.
*H05K 1/02* (2006.01)
*H04B 1/16* (2006.01)
*H05K 1/18* (2006.01)

(52) U.S. Cl.
CPC .............. *H05K 1/025* (2013.01); *H04B 1/16* (2013.01); *H05K 1/181* (2013.01); *H05K 2201/09272* (2013.01); *H05K 2201/09281* (2013.01); *H05K 2201/10045* (2013.01); *H05K 2201/10098* (2013.01)

(58) Field of Classification Search
CPC .................. H05K 1/025; H05K 1/181; H05K 2201/09272; H05K 2201/09281; H05K 2201/10045; H05K 2201/10098; H04B 1/16; H04B 1/12

USPC ......................................................... 455/130
See application file for complete search history.

(56) References Cited

U.S. PATENT DOCUMENTS

| 2005/0170790 A1* | 8/2005 | Chang .................... H04B 1/005 455/90.3 |
| 2008/0180350 A1 | 7/2008 | Bonnet et al. |
| 2010/0134183 A1* | 6/2010 | Miyazaki ................ H01L 23/66 257/E29.007 |
| 2014/0210486 A1* | 7/2014 | Dijkstra ................. H01Q 21/08 324/612 |
| 2017/0005412 A1* | 1/2017 | DeLisio, Jr. ............ H03F 3/602 |

(Continued)

FOREIGN PATENT DOCUMENTS

| EP | 3618106 A1 | 3/2020 |
| FR | 2911998 A1 | 8/2008 |

(Continued)

*Primary Examiner* — Don N Vo
(74) *Attorney, Agent, or Firm* — Slater Matsil, LLP

(57) ABSTRACT

A device includes a printed circuit board substrate, an antenna connected to the printed circuit board substrate, an amplifier connected to the printed circuit board substrate, and a matching track having a first end electrically connected to an input of the amplifier and a second end electrically connected to an output of the antenna. The matching track has an outgrowth that is symmetrical along a median axis of the outgrowth. The matching track is rectilinear and has a constant width over an initial part extending between the widening area and the first end. A median axis of the initial part and the median axis of the outgrowth form an angle comprised between 60 and 120°.

25 Claims, 5 Drawing Sheets

(56) References Cited

U.S. PATENT DOCUMENTS

2020/0075445 A1   3/2020  Ory et al.
2022/0294402 A1*  9/2022  Takahashi ........... H03F 3/45179

FOREIGN PATENT DOCUMENTS

| KR | 102049876 B1 | 11/2019 |
| WO | 2008031042 A1 | 3/2008 |
| WO | 2008116938 A1 | 10/2008 |

* cited by examiner

PRINTED CIRCUIT BOARD

CROSS-REFERENCE TO RELATED APPLICATIONS

This application claims priority to French Patent Application No. 2011603, filed on Nov. 12, 2020.

FIELD OF THE INVENTION

The present invention relates, general, to printed circuits. More particularly it relates to printed circuits comprising an antenna and a Low Noise Amplifier or LNA, connected together.

PRIOR ART

A low noise amplifier is an electronic device allowing to amplify very low power signals, for example from an antenna. An amplifier is characterised by its noise figure (NF). The noise figure is the ratio between on the one hand the ratio between the power of the signal to be amplified, received by an input of the amplifier, and the power of the noise, received by the input of the amplifier, and on the other hand the ratio between the power of the amplified signal, emitted by an output of the amplifier, and the power of the noise, emitted by the output of the amplifier. By definition, the noise figure of an amplifier is always greater than 1 (or 0 in dB), because an amplifier adds noise during amplification. A low noise amplifier is an amplifier whose noise figure is close to 1.

A low noise amplifier is also characterised by its input impedance. In order to minimise the noise figure, low noise amplifiers generally have an input impedance different from 50 ohms.

An antenna allows to receive a radio wave and transform it into an electrical signal. This electrical signal is emitted on an output of the antenna and received by the amplifier on its input. An antenna is characterised by its output impedance. In order to minimise the bulk of the antenna, the output impedance of the antenna is typically 50 ohms.

In order to limit the losses undergone by the electrical signal transmitted from the antenna to the amplifier, it is advantageous that the impedance of the output of the antenna is equal to the impedance of the input of the amplifier. If this is not the case, it is advantageous to make an impedance matching between the output impedance of the antenna and the input impedance of the amplifier.

It is known to use discrete components, for example coils and capacitors, to connect the output of the antenna and the input of the low noise amplifier while achieving this impedance matching. However, these discrete components are expensive, they occupy a large volume and the presence of solder to attach them limits the reproducibility of an impedance matching using discrete components.

It is also known to use Monolithic Microwave Integrated Circuits or MMIC manufactured for example with gallium arsenide (AsGa), however this type of integrated circuit is expensive. In the event that the system comprises several thousand antenna amplifier pairs, this type of integrated circuit makes the system very expensive.

There is therefore a need for a printed circuit wherein the output of an antenna and the input of a low noise amplifier are connected and matched in impedance and which does not have these disadvantages.

DESCRIPTION OF THE INVENTION

To this end provision is made, according to the invention, of a printed circuit configured to receive a signal whose carrier frequency is comprised between 10 GHz and 30 GHz, the printed circuit comprises an antenna configured to receive the signal, an amplifier configured to amplify the received signal and a matching track. A first end of the matching track is electrically connected to an input of the amplifier, a second end of the matching track is electrically connected to an output of the antenna. The matching track comprises an outgrowth which is symmetrical along a median axis, the outgrowth starting from a widening area of the matching track, the matching track is rectilinear and has a constant width over an initial part extending between the widening area and the first end. A median axis of the initial part and the median axis of the outgrowth forms an angle comprised between 60 and 120°.

The printed circuit shown therefore allows to connect the output of the antenna and the input of the amplifier while performing an impedance matching. The elements used for impedance matching do not use discrete components and occupy a surface area comprised between 4 and 6 mm$^2$.

Thus, this printed circuit can be integrated into receivers, for example receivers of satellite signals whose signal is of the millimetre type, comprising a plurality of antennas and amplifiers, because the impedance matching between the antennas and the amplifiers uses limited space. In addition, since the impedance matching is achieved by a special shape of the track connecting the antenna to the amplifier, the printed circuit is easily reproducible and inexpensive.

This plurality of antennas and amplifiers allows, for example, to carry out antenna processing, for example by beamforming.

This printed circuit can also be integrated into telecommunication signal receivers, for example signals following the 3GPP 5G standard.

In one embodiment, the constant width of the initial part is comprised between 100 and 200 μm. A surface area of the outgrowth is comprised between 0.2 and 0.4 mm$^2$. A distance between the widening area and the amplifier inlet is comprised between 500 and 1500 μm. The outgrowth comprises a proximal part located at the widening area and a distal part located at an opposite of the proximal part, a distance between the distal part of the outgrowth and the input of the amplifier is comprised between 2 and 3 mm.

In one embodiment the outgrowth is rectangular in shape, a width of the outgrowth is comprised between 200 and 400 μm and a length of the outgrowth is comprised between 800 and 1600 μm.

In one embodiment the outgrowth has a shape widening between the proximal part and the distal part.

In one embodiment, the printed circuit further comprises a flat support, the flat support comprises a conductive layer, an insulating layer and an amplifier junction track comprised in the conductive layer. The matching track is comprised in the conductive layer, the amplifier junction track is integral with the matching track, the amplifier input is soldered to the amplifier junction track.

In one embodiment, the printed circuit further comprises an antenna junction track comprised in the conductive layer. The antenna junction track is integral with the matching track and the output of the antenna is soldered on the antenna junction track.

In one embodiment, the antenna is an antenna track comprised in the conductive layer and the antenna track is integral with the matching track.

In one embodiment, the conductive layer has a thickness comprised between 20 and 80 μm and the insulating layer has a thickness comprised between 100 and 200 μm.

In one embodiment, the printed circuit further comprises a flat support, the flat support comprises a first conductive layer, a second conductive layer, an insulating layer located between the first conductive layer and the second conductive layer and an amplifier junction track comprised in the first conductive layer. The amplifier input being soldered to the amplifier junction track. The matching track is comprised in the second conductive layer and the amplifier junction track and the matching track are electrically connected by a metallised hole.

In one embodiment, the printed circuit further comprises an antenna junction track comprised in the first conductive layer, the antenna junction track and the matching track are electrically connected by a metallised hole and the output of the antenna are soldered on the antenna junction track.

In one embodiment, the antenna is an antenna track comprised in the second conductive layer and the antenna track is integral with the matching track.

In one embodiment, the antenna is an antenna track comprised in the first conductive layer and the antenna track is electrically connected to the matching track by a metallised hole.

In one embodiment, the first conductive layer has a thickness comprised between 20 and 80 μm, the second conductive layer has a thickness comprised between 15 μm and 30 μm, and the insulating layer has a thickness comprised between 100 and 200 μm.

In one embodiment, the amplifier AMP comprises a QFN FC type package and an integrated circuit.

The use of a QFN FC type package allows the cost of the printed circuit to be limited because this package has a low cost.

The invention also relates to a system for receiving satellite signals comprising the printed circuit described above.

DESCRIPTION OF THE FIGURES

Other features, purposes and advantages of the invention will emerge from the following description, which is purely illustrative and not restrictive and which should be read in relation to the appended drawings wherein.

DETAILED DESCRIPTION OF THE INVENTION

Figure 1:
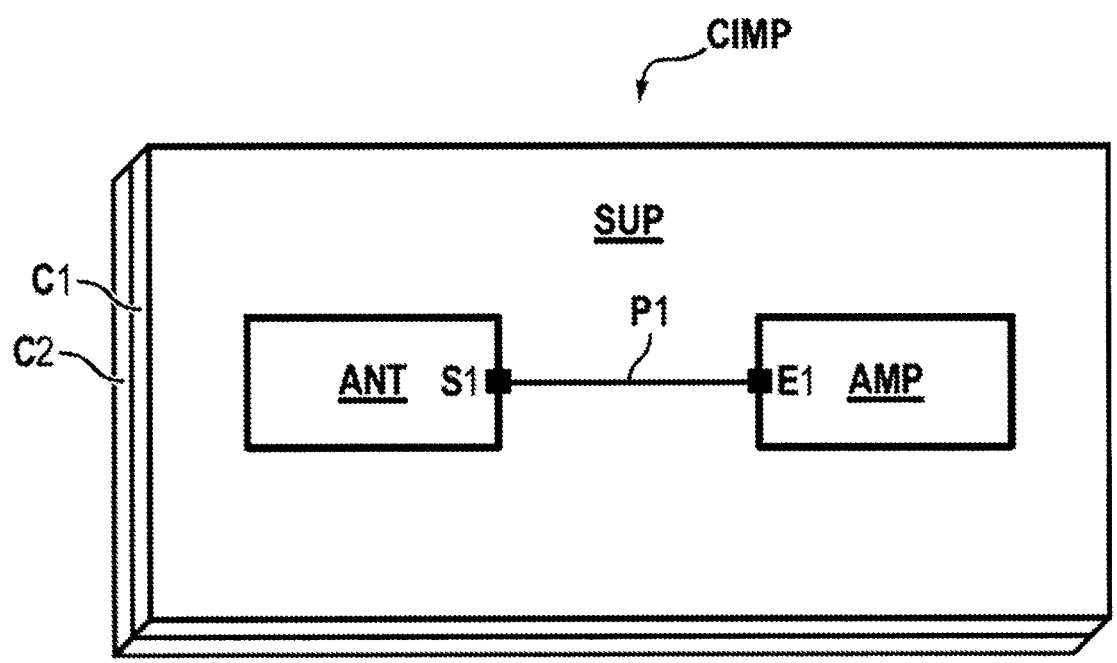
FIG. 1 shows in a first way the printed circuit of the invention.

FIG. 1 shows an integrated circuit CIMP or PCB for Printed Circuit Board, comprising an amplifier AMP and an antenna ANT. The amplifier AMP is of a low noise amplifier type.

The antenna ANT is configured to receive a signal with a carrier frequency comprised between 10 GHz and 30 GHz (millimetre signal). The amplifier AMP is configured to amplify the received signal.

The amplifier AMP comprises a QFN FC (Quad Flat No Lead Flip Chip) type package wherein an integrated circuit is positioned in a flipped manner. The integrated circuit amplifies the received signal. In electronics, Quad Flat No-lead (QFN) type packages are flat and no-lead integrated circuit packages that physically and electrically connect the integrated circuit to the printed circuit.

The distance between the edge of the package and the integrated circuit is comprised between 500 μm and 1000 μm, preferably between 675 μm and 700 μm.

The exposed metal parts of the package, soldered to the printed circuit CIMP, are connected to the integrated circuit by metallised tracks, the length of which is comprised between 500 and 600 μm and preferably 560 μm. The thickness of the metallised track is comprised between 100 μm and 200 μm. All the metallised tracks are comprised in the same plane.

With the constraints exposed, and thanks to a co-design optimisation, this type of package has one of the best compromises between low cost; minimum dimensions; good electrical performance with a good quality factor (Q factor) on the matching track of the amplifier AMP.

Thus the amplifier AMP is comprised in a package having a low cost and low volume.

The printed circuit comprises a flat support SUP which comprises a conductive layer C1 formed of an electrically conductive material (generally a layer of copper) and an insulating layer I1 formed of an electrically insulating material (generally a layer made of epoxy resin reinforced by a frame of glass fibres).

This printed circuit CIMP can be comprised in a device for receiving signals from satellites. These signals are generally modulated at a frequency which varies in the Ku band, for example between 11 GHz and 13 GHz.

For the sake of simplicity, the printed circuit CIMP is shown to comprise only one antenna ANT and one amplifier AMP, however it may include a plurality of antennas coupled to a plurality of amplifiers. Each amplifier can be connected to a plurality of antennas.

The plurality of amplifiers AMP and antennas ANT allow to make an array of antennas forming a network of controlled antennas, in order to form a virtual reception beam and orientable in the direction of an emitter of the signal to be received.

The conductive layer C1 is partly removed in order to produce areas on which the legs or pins of components can be soldered and to produce tracks allowing to connect the areas used for soldering together. Generally the conductive layer C1 is partially removed by etching using chemical means.

The antenna ANT has an output S1 to emit an electrical signal depending on a radio wave received by the antenna. The output S1 of the antenna ANT means the pin or leg of the antenna ANT emitting the electrical signal.

The amplifier AMP has an input E1 to receive the electrical signal. The input E1 of the amplifier AMP means the pin or the leg of the amplifier AMP receiving the electrical signal.

An impedance of the output S1 of the antenna ANT is 50 ohms. The value of 50 ohms for the impedance of the output S1 allows to minimise the bulk of the antenna ANT. Particularly if the antenna output had an impedance of 20 ohms the tracks should be wider than if the output impedance is 50 ohms, which causes a surface and routing problem An impedance of the input E1 of the amplifier AMP is comprised between 50 ohms and the optimum noise impedance (Zopt) which is advantageously 20 ohms. The value of 20 ohms for the input E1 impedance allows to minimise the noise figure of the amplifier AMP.

The output S1 of the antenna ANT and the input E1 of the amplifier AMP are connected by a matching track PIST.

The matching track PIST is configured to perform an impedance matching between the output of S1 the antenna ANT and the input E1 of the amplifier AMP.

Figure 2:
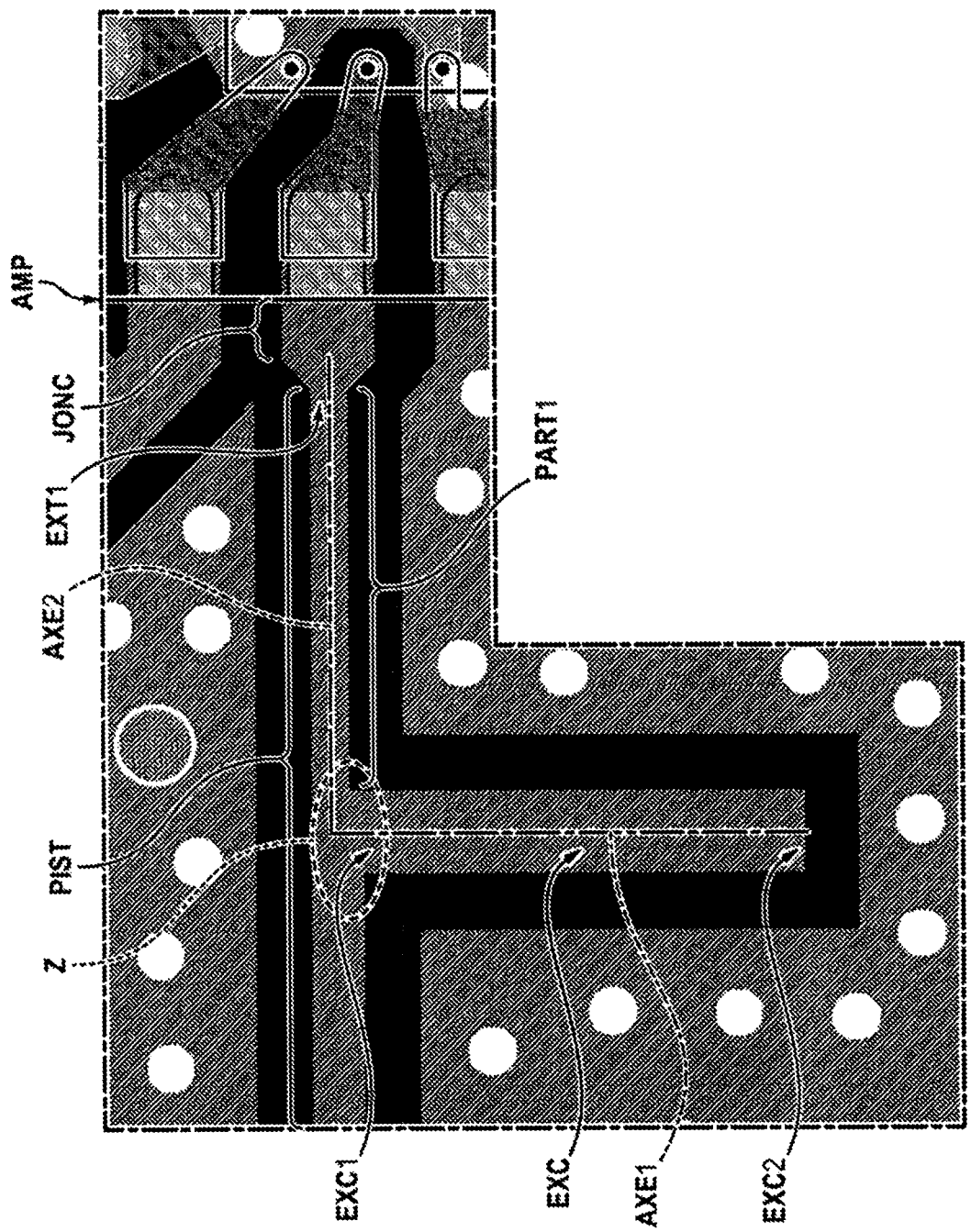
FIG. 2 shows in a second way the printed circuit of the invention.

FIG. 2 shows the shape of the matching track PIST in an area close to the input E1 of the amplifier AMP.

The matching track PIST is formed and therefore comprised in the conductive layer C1.

The matching track PIST has a first end EXT1 which is connected to the input E1 of the amplifier AMP.

The matching track PIST comprises an outgrowth EXC starting at a widening area Z of the matching track PIST. An initial part PART1 of the matching track PIST, comprised between the widening area Z and the first end EXT1, is rectilinear and of constant width.

The outgrowth EXC has a symmetry along a median axis AXE1. The initial part PART1 of the matching track PIST has a median axis AXE2. The median axis AXE1 of the outgrowth EXC and the median axis AXE2 of the initial part PART1 intersect, forming an angle comprised between 60° and 120° with advantageously a value of 120°. This value of 120° allows to reduce the surface area of the track and the distancing from adjacent tracks.

This outgrowth EXC in combination with the initial part PART1 of the matching track PIST behaves like a circuit comprising an inductor and a capacitor connected in parallel or in series. This allows matching between the impedance of the output S1 of the antenna ANT and the input E1 impedance of the amplifier AMP.

The width of the initial part PART1 of the matching track PIST is comprised between 100 and 200 μm, with advantageously a value of 100 μm.

A distance between the widening area Z of the matching track PIST and the input E1 of the amplifier AMP is comprised between 500 and 1500 μm, with advantageously a value of 1250 μm.

The outgrowth EXC has a surface area comprised between 0.2 and 0.4 mm$^2$.

The outgrowth EXC has a proximal part EXC1 located at the widening area Z and a distal part EXC2 located opposite the proximal part.

A distance between the distal part EXC2 and the input E1 of the amplifier AMP is comprised between 2 and 3 mm, with advantageously a value of 3 mm.

The outgrowth EXC may have a rectangular shape, a width of which is comprised between 200 μm and 400 μm and a length comprised between 800 μm and 1600 μm, with advantageously a width of 285 μm and a length of 1170 μm.

The outgrowth EXC can be shaped like a butterfly wing. In this case, the outgrowth EXC has a shape which widens between the proximal part EXC1 and the distal part EXC2.

The printed circuit CIMP also comprises an amplifier junction track JONC. The input E1 of the amplifier AMP and more specifically a leg or a pin associated with this input E1 is soldered to this junction track JONC. This junction track JONC is formed and therefore comprised in the conductive layer C1 and is integral with the matching track PIST.

The antenna ANT can be an antenna track whose shape is adapted for receiving a signal, for example a satellite signal. This antenna track can be produced in the conductive layer C1. In this case, the antenna track and the matching track PIST can be integral.

The antenna ANT can also be a plurality of patch type antennas located in the conductive layer C1.

The antenna ANT can also be terminations located in the conductive layer C2 covered by the conductive layer C1 (for example a metal layer), the conductive layer C1 which comprises openings/slots facing the termination of the conductive layer C2. In this case, the antenna is in turn made with the same materials as those of the printed circuit CIMP.

The antenna ANT can be a module attached to the support SUP. The printed circuit CIMP comprises an antenna junction track. The output S1 of the antenna and more particularly a leg or a pin associated with this output S1 is soldered to the antenna junction track. This antenna junction track is formed and therefore comprised in the conductive layer C1 and can be integral with the matching track PIST.

Figure 3:
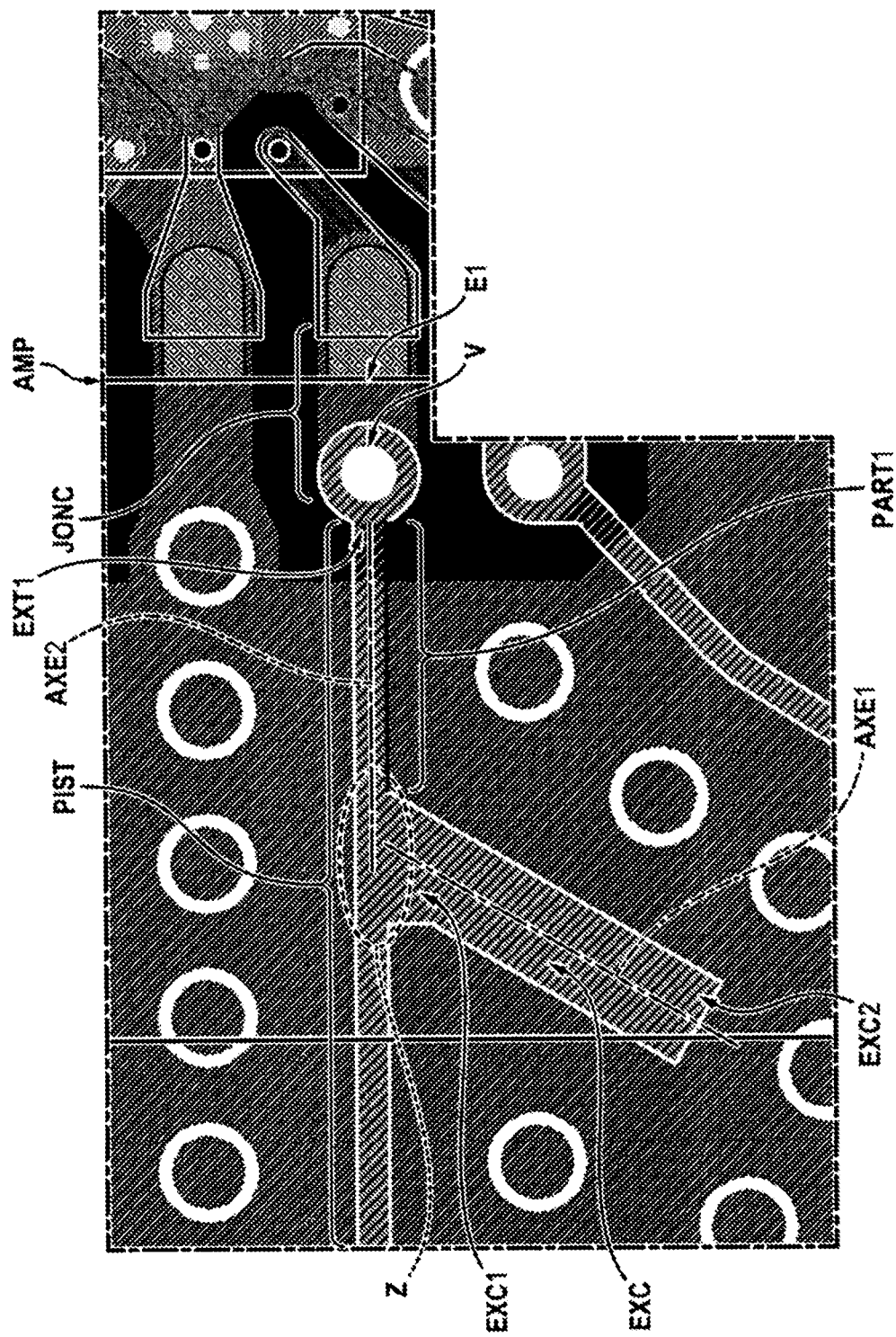
FIG. 3 shows in a third way the printed circuit of the invention.

FIG. 3 shows another embodiment of the printed circuit CIMP. In this embodiment, the support SUP comprises two conductive layers formed of a conductive material. The two conductive layers are separated by an insulating layer formed from an insulating material.

The printed circuit CIMP also comprises a third conductive layer which allows to provide a ground to the various radio frequency elements (amplifiers AMP and antennas ANT).

In this embodiment, the junction track JONC is comprised in a first conductive layer of the conductive layers and the matching track PIST is comprised in a second conductive layer of the conductive layers. Advantageously, the first conductive layer is a top layer of the substrate, which facilitates the soldering of the legs or pins of the amplifier AMP on the junction track JONC. The second conductive layer is comprised between the insulating layer and the third conductive layer and is therefore a buried layer.

Thus in this embodiment, the junction track JONC is in the second conductive layer C2. It is buried between the first conductive layer C1 (ground) and the third conductive layer C3 (ground). This allows to shield the signal from the various external radio frequency elements.

The printed circuit CIMP comprises a metallised hole or via V, located at the first end EXT1 of the matching track PIST. This metallised hole allows an electrical connection between the matching track PIST and the junction track JONC.

The antenna ANT can be produced in the second conductive layer by an antenna track whose shape is adapted for receiving a signal, for example a satellite signal. In this case, the antenna track and the matching track PIST can be integral. The first conductive layer then comprises slots at the antenna ANT in order to pass the radio signal.

The antenna ANT can be made in the first conductive layer by an antenna track whose shape is adapted for receiving a signal, for example a satellite signal. In this case, the antenna track and the matching track PIST can be electrically connected by a metallised hole.

The antenna ANT can be a module attached to the support SUP. The printed circuit CIMP comprises an antenna junction track. The output S1 of the antenna ANT and more particularly a leg or a pin associated with the output S1, is soldered to the antenna junction track. If the antenna junction track is comprised in the first conductive layer, the antenna junction track can be integral with the matching track PIST. If the antenna junction track is comprised in the second conductive layer, the matching track PIST and the antenna junction track can be electrically connected by a metallised hole.

Thus, several organisations of the antenna ANT and the matching track PIST may exist, including in particular:

the matching track PIST is comprised in the first layer C1 and the antenna ANT is comprised in the first layer C1, in this case there is no need for a metallised hole (VIA)

to connect the matching track PIST and the antenna ANT and the two elements can for example be integral, the matching track PIST is comprised in the first layer C1 and the antenna ANT is comprised in the second layer C2, in this case the matching track PIST and the antenna ANT can be connected by a metallised hole (VIA), the matching track PIST is comprised in the second layer C2 and the antenna ANT is comprised in the second layer C2, in this case there is no need for a metallised hole (VIA) to connect the matching track PIST and the antenna ANT and the two elements can for example be integral, the matching track PIST is comprised in the second layer C2 and the antenna ANT is comprised in the first layer C1, in this case the matching track PIST and the antenna ANT can be connected by a metallised hole (VIA), the matching track PIST is comprised in the first layer C1 or the second layer C2 and the antenna ANT is comprised on the other side of the printed circuit CIMP, in this case the antenna ANT and the matching track PIST are connected by a metallised hole (VIA) and whose metallised hole passes through the entire printed circuit CIMP.

The advantage of locating the matching track PIST in the second layer C2 is that the matching track PIST is more immune to the couplings of the antenna radiation but in this case the presence of the metallised holes brings more losses in this case.

Figure 4:
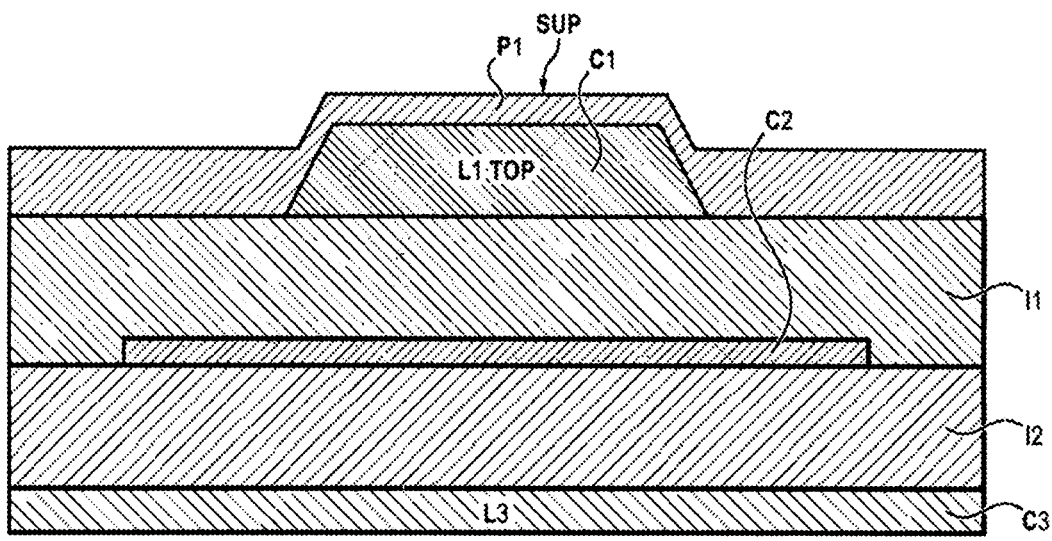
FIG. 4 shows the flat support of the printed circuit of the invention.

FIG. 4 shows a flat support SUP in one embodiment where it comprises 3 conductive layers (C1, C1 and C3) and two insulating layers (I1 and I2).

The conductive layer C1 is located on the surface of the flat support SUP. This conductive layer C1 has a thickness comprised between 20 and 80 µm.

This conductive layer C1 can optionally be covered with a protective layer P1 formed of a resist or an alloy of nickel and gold (NiAu). This protective layer P1 has a thickness comprised between 10 µm and 20 µm for the resist and 5 µm for NiAu.

The insulating layer I1 is located under the conductive layer C1. This insulating layer I1 has a thickness comprised between 100 µm and 200 µm.

The conductive layer C2 is located under the insulating layer I1. This conductive layer C2 has a thickness comprised between 15 µm and 30 µm.

The insulating layer I2 is located under the conductive layer C2. This insulating layer I2 has a thickness comprised between 100 µm and 200 µm.

The conductive layer C3 is located under the insulating layer I2.

Thus the flat support SUP comprises a sandwich of 6 layers placed one on top of each other and which are successively:

The protective layer P1,
The conductive layer C1,
The insulating layer I1,
The conductive layer C2,
The insulating layer I2 and
The conductive layer C3.

The conductive layer C1 allows to solder the legs or pins of the amplifier AMP.

The matching track PIST is comprised in the conductive layer C1 or in the conductive layer C2. In the case where the matching track PIST is comprised in the conductive layer C1, this matching track PIST is connected to the input E1 of the amplifier AMP by the junction track JONC, as shown in FIG. 2. In the case where the matching track PIST is comprised in the conductive layer C2, this track is connected to the input E1 of the amplifier AMP by the metallised hole V and the junction track JONC, as shown in FIG. 3.

If the antenna is an antenna track, this antenna track can be comprised in the conductive layer C1 or in the conductive layer C2.

If the antenna track and the matching track PIST are comprised in the same conductive layer, these tracks can be integral.

If the antenna track and the matching track PIST are not comprised in the same conductive layer, these tracks can be electrically connected by a metallised hole.

Figure 5A:
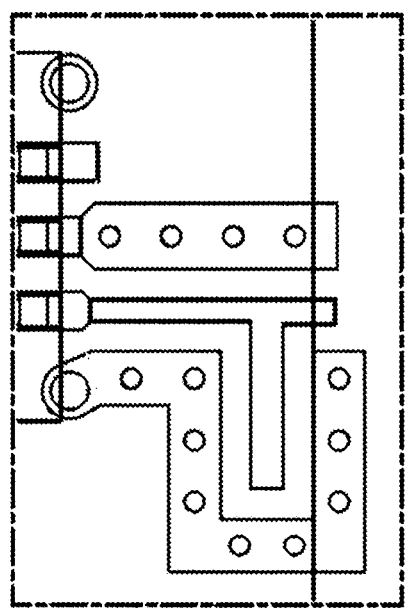
FIGS. 5a and 5b show in two other ways the printed circuit of the invention.
Figure 5B:
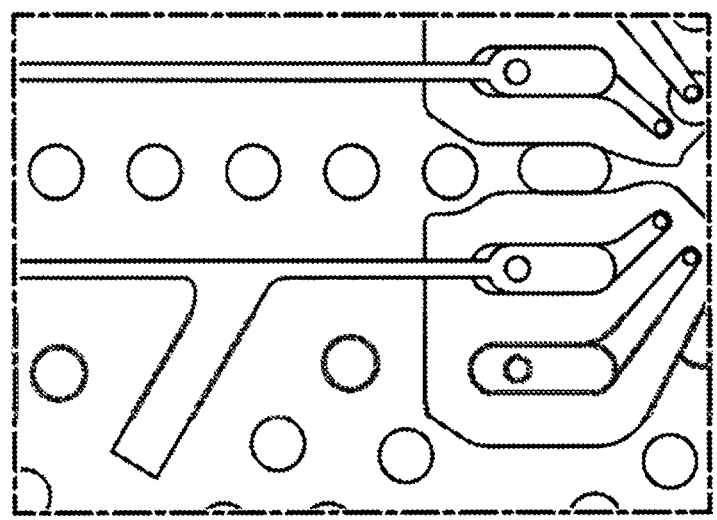

FIGS. 5a and 5b show the printed circuit CIMP in two other ways. FIG. 5a is the CAD (Computer Aided Design) view of the drawings of the masks of a part of the printed circuit comprising the matching track PIST and the package. FIG. 5b is an x-ray photograph of the matching track PIST and amplifier AMP package.

The various parameters of the matching track PIST, in particular the width of the initial part PART1, the distance between the widening area Z of the matching track PIST and the input E1 of the amplifier AMP, the angle comprised between the median axis AXE1 and the median axis AX2, the surface area of the outgrowth EXC or the length and width of the outgrowth EXC, are determined jointly and with the features of the junction track JONC, the antenna and any metallised holes connecting the matching track PIST to the antenna track or to the junction track and the input E1 of the amplifier AMP as well as with the thickness of the printed circuit CIMP, the thickness of the different layers of the printed circuit CIMP, the features of the package containing the amplifier AMP (in particular its volume and the location of the legs).

The invention claimed is:

1. A device comprising:
a printed circuit board substrate;
an antenna connected to the printed circuit board substrate;
an amplifier connected to the printed circuit board substrate; and
a matching track having a first end electrically connected to an input of the amplifier and a second end electrically connected to an output of the antenna;
wherein the matching track comprises an outgrowth that is symmetrical along a median axis of the outgrowth, the outgrowth starting from a widening area of the matching track;
wherein the matching track is rectilinear and has a constant width over an initial part extending between the widening area and the first end; and
wherein a median axis of the initial part and the median axis of the outgrowth form an angle comprised between 60 and 120°.

2. The device according to claim 1, wherein the antenna is configured to receive a signal with a carrier frequency between 10 GHz and 30 GHz and wherein the amplifier is configured to amplify the received signal.

3. The device according to claim 1, wherein the antenna is configured to receive satellite signals.

4. The device according to claim 1, wherein the constant width of the initial part is between 100 and 200 µm;

wherein a surface area of the outgrowth is between 0.2 and 0.4 mm²;

wherein a distance between the widening area and the amplifier input is between 500 and 1500 µm; and wherein the outgrowth comprises a proximal part located at the widening area and a distal part located at an opposite of the proximal part, a distance between the distal part of the outgrowth and the input of the amplifier being between 2 and 3 mm.

5. The device according to claim 1, wherein the outgrowth is rectangular in shape, a width of the outgrowth being between 200 and 400 µm and a length of the outgrowth being between 800 and 1600 µm.

6. The device according to claim 1, wherein the outgrowth comprises a proximal part located at the widening area and a distal part located at an opposite of the proximal part, the outgrowth having a shape widening between the proximal part and the distal part.

7. The device according to claim 1, wherein the printed circuit board substrate comprises:
a conductive layer;
an insulating layer; and
an amplifier junction track that is part of the conductive layer;
wherein the matching track is part of the conductive layer;
wherein the amplifier junction track is integral with the matching track; and
wherein the amplifier input is electrically and mechanically connected to the amplifier junction track.

8. The device according to claim 7, wherein the amplifier input is soldered to the amplifier junction track.

9. The device according to claim 7, further comprising an antenna junction track that is part of the conductive layer, the antenna junction track being integral with the matching track and the output of the antenna being electrically and mechanically connected to the antenna junction track.

10. The device according to claim 7, wherein the antenna is an antenna track that is part of the conductive layer and the antenna track is integral with the matching track.

11. The device according to claim 7, wherein the conductive layer has a thickness between 20 and 80 µm and the insulating layer has a thickness between 100 and 200 µm.

12. The device according to claim 1, wherein the printed circuit board substrate comprises:
a first conductive layer;
a second conductive layer;
an insulating layer between the first conductive layer and the second conductive layer;
metallized hole extending through the insulating layer from the first conductive layer to the second conducive layer;
an amplifier junction track that is part of the first conductive layer;
wherein the amplifier input is electrically and mechanically connected to the amplifier junction track;
wherein the matching track is part of the second conductive layer; and
wherein the amplifier junction track and the matching track are electrically connected by the metallized hole.

13. The device according to claim 12, wherein the antenna is an antenna track that is part of the second conductive layer and wherein the antenna track is integral with the matching track.

14. The device according to claim 12, wherein the antenna is an antenna track that is part of the first conductive layer and wherein the antenna track is electrically connected to the matching track by the metallized hole.

15. The device according claim 12, wherein the first conductive layer has a thickness between 20 and 80 µm, the second conductive layer has a thickness between 15 µm and 30 µm, and the insulating layer has a thickness between 100 and 200 µm.

16. The device according to claim 1, wherein the amplifier comprises an integrated circuit within a QFN FC type package.

17. A device comprising:
a conductive layer;
an insulating layer;
an amplifier junction track that is part of the conductive layer;
an amplifier having an amplifier input that is electrically and mechanically connected to the amplifier junction track;
an antenna; and
a matching track having a first end electrically connected to the input of the amplifier and a second end electrically connected to an output of the antenna;
wherein the matching track comprises an outgrowth that is symmetrical along a median axis of the outgrowth, the outgrowth starting from a widening area of the matching track;
wherein the matching track is rectilinear and has a constant width over an initial part extending between the widening area and the first end; and
wherein a median axis of the initial part and the median axis of the outgrowth form an angle comprised between 60 and 120°.

18. The device according to claim 17, wherein the matching track is part of the conductive layer and the amplifier junction track is integral with the matching track.

19. The device according to claim 18, further comprising an antenna junction track that is part of the conductive layer, the antenna junction track being integral with the matching track and the output of the antenna being electrically and mechanically connected to the antenna junction track.

20. The device according to claim 18, wherein the antenna is an antenna track that is part of the conductive layer and the antenna track is integral with the matching track.

21. The device according to claim 17, further comprising:
a second conductive layer adjacent the insulating layer so that the insulating layer is between the conductive layer and the second conductive layer;
a metallized hole extending through the insulating layer from first conductive layer to the second conducive layer;
wherein the matching track is part of the second conductive layer; and
wherein the amplifier junction track and the matching track are electrically connected by the metallized hole.

22. The device according to claim 21, wherein the antenna is an antenna track that is part of the second conductive layer and wherein the antenna track is integral with the matching track.

23. The device according to claim 21, wherein the antenna is an antenna track that is part of the conductive layer and wherein the antenna track is electrically connected to the matching track by the metallized hole.

24. A method comprising:
providing a printed circuit board substrate, an antenna connected to the printed circuit board substrate, an amplifier connected to the printed circuit board substrate, and a matching track having a first end electrically connected to an input of the amplifier and a second end electrically connected to an output of the antenna, wherein the matching track comprises an outgrowth that is symmetrical along a median axis of the outgrowth, the outgrowth starting from a widening area of the matching track, wherein the matching track is rectilinear and has a constant width over an initial part extending between the widening area and the first end, and wherein a median axis of the initial part and the median axis of the outgrowth form an angle comprised between 60 and 120°;

receiving a signal with a carrier frequency between 10 GHz and 30 GHz at the antenna; and amplifying the received signal at the amplifier.

25. The method according to claim 24, wherein the received signal is a satellite signal.

* * * * *